(12) United States Patent
Kitano et al.

(10) Patent No.: US 9,089,055 B2
(45) Date of Patent: Jul. 21, 2015

(54) ELECTRONIC DEVICE, METHOD OF MANUFACTURING THE SAME, AND OSCILLATOR

(71) Applicant: Seiko Epson Corporation, Tokyo (JP)

(72) Inventors: Yoji Kitano, Chino (JP); Norio Okuyama, Suwa (JP)

(73) Assignee: Seiko Epson Corporation (JP)

( * ) Notice: Subject to any disclaimer, the term of this patent is extended or adjusted under 35 U.S.C. 154(b) by 0 days.

(21) Appl. No.: 14/018,686

(22) Filed: Sep. 5, 2013

(65) Prior Publication Data

US 2014/0070900 A1    Mar. 13, 2014

(30) Foreign Application Priority Data

Sep. 11, 2012   (JP) .................................. 2012-199160

(51) Int. Cl.
*H01L 23/053* (2006.01)
*H05K 5/02* (2006.01)
*B81B 7/00* (2006.01)

(52) U.S. Cl.
CPC ............ *H05K 5/0217* (2013.01); *B81B 7/0041* (2013.01); *B81B 2201/0285* (2013.01); *B81B 2203/0118* (2013.01); *B81C 2203/0136* (2013.01); *B81C 2203/0145* (2013.01); *B81C 2203/0163* (2013.01); *H01L 23/053* (2013.01); *Y10T 29/49002* (2015.01)

(58) Field of Classification Search
CPC ............................ H01L 23/053; H05K 5/0217
USPC ..... 331/107 R, 116 R, 154, 158; 361/679.01; 29/729, 415, E29.324
See application file for complete search history.

(56) References Cited

U.S. PATENT DOCUMENTS

| | | | |
|---|---|---|---|
| 6,852,926 B2* | 2/2005 | Ma et al. | 174/539 |
| 2008/0105951 A1 | 5/2008 | Sato et al. | |
| 2011/0241136 A1* | 10/2011 | Inaba | 257/415 |
| 2012/0104593 A1* | 5/2012 | Kanemoto et al. | 257/729 |

FOREIGN PATENT DOCUMENTS

| | | |
|---|---|---|
| JP | 05-203682 | 8/1993 |
| JP | 07-239241 | 9/1995 |
| JP | 10-153498 | 6/1998 |
| JP | 2005-291978 A | 10/2005 |
| JP | 2008-114354 A | 5/2008 |
| JP | 2009-105411 A | 5/2009 |

* cited by examiner

*Primary Examiner* — Joseph Chang
*Assistant Examiner* — Jeffrey Shin
(74) *Attorney, Agent, or Firm* — Harness, Dickey & Pierce, P.L.C.

(57) ABSTRACT

An electronic device includes a substrate, a cavity part formed above the substrate with a functional device placed therein, a coating structure that defines the cavity part, and the coating structure has a first surrounding wall formed around the cavity part above the substrate, a second surrounding wall formed around the cavity part above the first surrounding wall, a coating layer that defines an upper surface of the cavity part, wherein the second surrounding wall is located inside the first surrounding wall in a plan view.

9 Claims, 6 Drawing Sheets

ELECTRONIC DEVICE, METHOD OF MANUFACTURING THE SAME, AND OSCILLATOR

BACKGROUND

1. Technical Field

The present invention relates to an electronic device, a method of manufacturing an electronic device, and an oscillator.

2. Related Art

MEMS (Micro Electro Mechanical Systems) is one of micro structure formation technologies and refers to a technology of forming minute electromechanical systems on the order of micrometers and resulting products.

Major devices manufactured by the MEMS technology include vibrators, sensors, and actuators. As the MEMS devices, many devices having movable parts and reading out changes of capacitance due to minute displacement of the movable parts as signals have been known. In the MEMS devices, the displacement of the movable parts are excessively small and gasses including air that inhibits displacement cause reduction in performance and reliability of the devices. For example, it has been known that performance including frequency accuracy and sensitivity of vibrators, pressure sensors, etc. is remarkably improved when the resistance due to the gases such as the air is reduced, and it is desirable that the gases surrounding the MEMS devices are as little as possible. Accordingly, a method of improving device characteristics by placing MEMS devices in cavity parts under reduced pressure and air-tightly sealing them has been studied. Further, an attempt to improve the degree of vacuum within the cavity parts by a sealing method, a sealing structure, or the like has been made.

For example, Patent Document 1 (JP-A-2008-114354) discloses an electronic device having a coating structure that defines a cavity part in which a functional device such as an MEMS device is placed. In the electronic device of Patent Document 1, the coating structure has a multilayered structure including interlayer insulating films and wiring layers and forms an upper coating part (coating layer) that coats the cavity part from above by a part of the wiring layer.

However, in the electronic device of Patent Document 1, for example, when a protective resin including polyimide used for mounting on an electronic substrate is applied, the coating layer that coats the cavity part from above may bend due to pressure of the application. Further, for example, the coating layer that coats the cavity part from above may bend due to pressure of dicing when chipping and pressure when the rear surface of the substrate is ground. When the coating layer bends, a problem that the degree of vacuum within the cavity part becomes lower or, in the worst case, a problem that the coating layer comes into contact with the functional device may occur.

SUMMARY

An advantage of some aspects of the invention is to provide an electronic device that can suppress bending of a coating layer defining a cavity part in which a functional device is placed and a method of manufacturing the electronic device. Another advantage of some aspects of the invention is to provide an oscillator including the electronic device.

An electronic device according to an aspect of the invention includes a substrate, a functional device provided above the substrate, a first surrounding wall provided around the functional device above the substrate, a second surrounding wall located inside the first surrounding wall in a plan view and provided to surround the functional device above the first surrounding wall, and a coating structure overlapping with the functional device in the plan view above the second surrounding wall.

According to the electronic device, the second surrounding wall is located inside the first surrounding wall in the plan view, and thus, the area of the region covering the upper part of a cavity part of the coating layer may be made smaller. Accordingly, bending of the coating layer may be suppressed.

Note that, in the description according to the invention, in the case where the term "above" is used to include, for example, "above" a particular object (hereinafter, referred to as "A"), another particular object (hereinafter, referred to as "B") is formed, the case includes the case where B is directly formed on A and the case where B is formed on A via another object.

The electronic device according to the aspect of the invention may be configured such that the coating layer is integrated with the second surrounding wall.

According to the electronic device of this configuration, bending of the coating layer can be suppressed.

The electronic device according to the aspect of the invention may be configured such that a third surrounding wall is located between the first surrounding wall and the second surrounding wall in a direction in which the substrate overlaps with the functional device and between the first surrounding wall and the second surrounding wall in the plan view.

According to the electronic device of this configuration, bending of the coating layer can be further suppressed.

The electronic device according to the aspect of the invention may be configured such that the first surrounding wall and the second surrounding wall define a side surface of a region in which the functional device is provided.

According to the electronic device of this configuration, bending of the coating layer can be suppressed.

A method of manufacturing an electronic device according to another aspect of the invention includes forming a functional device above a substrate, forming a first interlayer insulating layer above the substrate to cover the functional device, forming a first surrounding wall that surrounds the functional device in the first interlayer insulating layer, forming a second interlayer insulating layer above the first interlayer insulating layer, forming a second surrounding wall that surrounds the functional device in the second interlayer insulating layer, forming a coating layer above the second interlayer insulating layer, forming a through hole in the coating layer, and forming a cavity part by removing the first interlayer insulating layer and the second interlayer insulating layer above the functional device through the through hole, wherein in the forming of the second interlayer insulating layer, the second surrounding wall is formed inside the first surrounding wall in a plan view.

According to the method of manufacturing an electronic device, the second surrounding wall is formed inside the first surrounding wall in the plan view, and thus, the area of the region of the coating layer covering the upper part of the cavity part can be made smaller. Accordingly, the electronic device that may suppress bending of the coating layer can be obtained.

An oscillator according to still another aspect of the invention includes the electronic device according to the aspect of the invention, and a circuit unit electrically connected to the functional device of the electronic device.

The oscillator may include the electronic device that can suppress bending of the coating layer defining the cavity part in which the functional device is placed.

The method of manufacturing the electronic device may be configured such that in the forming of the coating layer, the coating layer is formed integrally with the second surrounding wall.

According to the method of manufacturing the electronic device of this configuration, the electronic device that can suppress bending of the coating layer can be obtained.

The method of manufacturing the electronic device according to the aspect of the invention may be configured such that the method further includes forming a third interlayer insulating layer above the first interlayer insulating layer before the forming of the second interlayer insulating layer, and forming a third surrounding wall that surrounds the functional device in the third interlayer insulating layer, wherein in the forming of the third surrounding wall, the third surrounding wall is formed inside the first surrounding wall in the plan view, and in the forming of the second surrounding wall, the second surrounding wall is formed inside the third surrounding wall in the plan view.

According to the method of manufacturing the electronic device of this configuration, the electronic device that can further suppress bending of the coating layer can be obtained.

BRIEF DESCRIPTION OF THE DRAWINGS

The invention will be described with reference to the accompanying drawings, wherein like numbers reference like elements.

DESCRIPTION OF EXEMPLARY EMBODIMENTS

As below, preferred embodiments of the invention will be explained in detail using the drawings. Note that the embodiments to be explained do not unduly limit the content of the invention described in the appended claims. Further, all of the configurations to be explained are not necessarily the essential component elements of the invention.

1. Electronic Device

Figure 1:
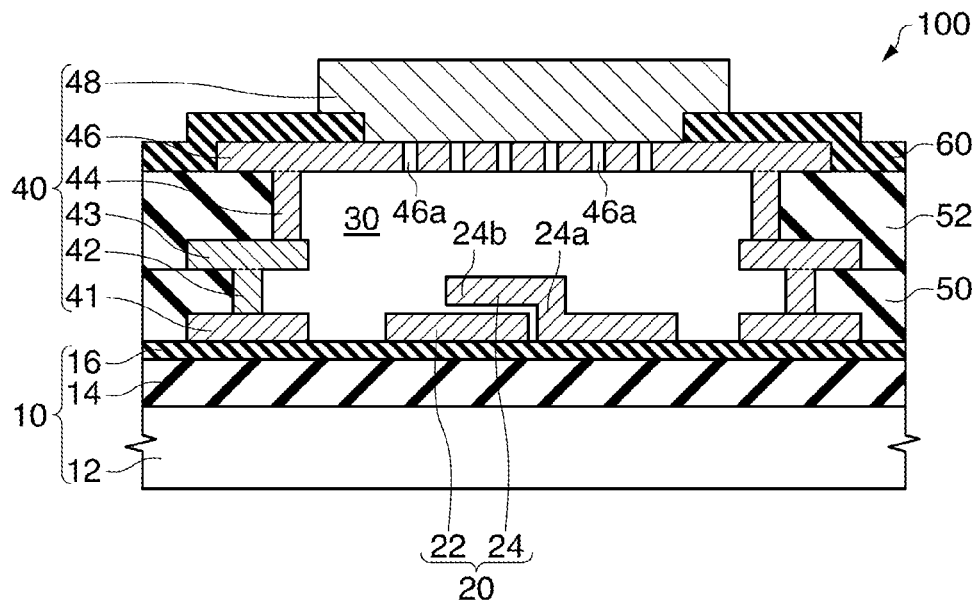
FIG. 1 is a sectional view schematically showing an electronic device according to an embodiment of the invention.
Figure 2:
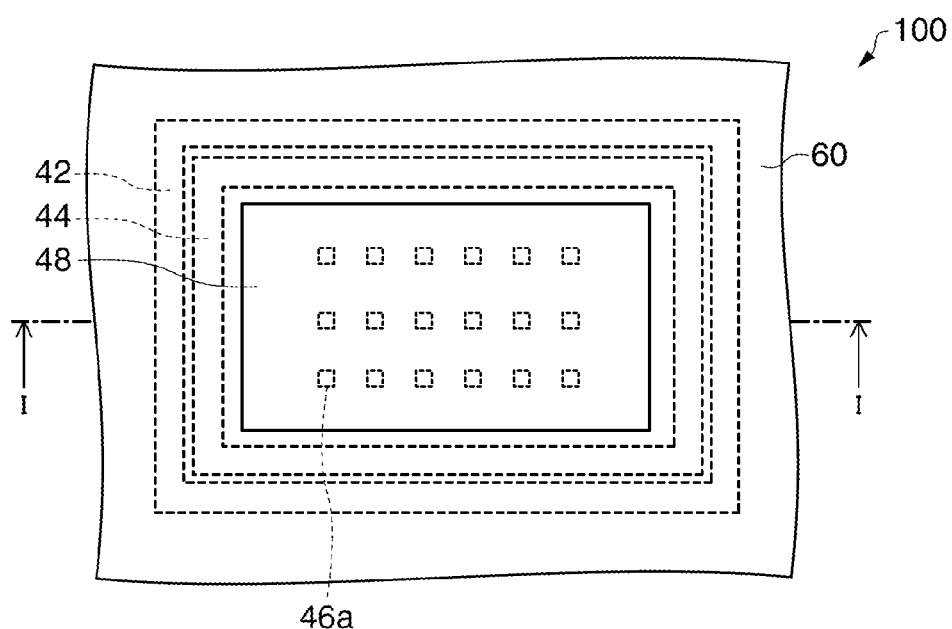
FIG. 2 is a plan view schematically showing the electronic device according to the embodiment.

First, an electronic device according to an embodiment will be explained with reference to the drawings. FIG. 1 is a sectional view schematically showing an electronic device 100 according to the embodiment. FIG. 2 is a plan view schematically showing the electronic device 100 according to the embodiment. Note that FIG. 1 is the sectional view along line I-I in FIG. 2.

As shown in FIG. 1, the electronic device 100 includes a substrate 10, a functional device 20, a cavity part 30, and a coating structure 40. Further, the electronic device 100 may include interlayer insulating layers 50, 52, and a passivation layer 60.

As shown in FIG. 1, the substrate 10 may have a support substrate 12, a first foundation layer 14, and a second foundation layer 16.

As the support substrate 12, for example, a semiconductor substrate including a silicon substrate is used. As the support substrate 12, various substrates including a ceramics substrate, a glass substrate, a sapphire substrate, a diamond substrate, and a synthetic resin substrate may be used.

The first foundation layer 14 is formed on the support substrate 12. As the first foundation layer 14, for example, a LOCOS (local oxidation of silicon) insulating layer, a semi-recess LOCOS insulating layer, or a trench insulating layer is used. The first foundation layer 14 may electrically separate the functional device 20 from other devices (for example, a transistor or the like, not shown).

The second foundation layer 16 is formed on the first foundation layer 14. As the second foundation layer 16, for example, a silicon nitride layer is used. The second foundation layer 16 may function as an etching stopper layer at a releasing step, which will be described later.

The functional device 20 is formed on the substrate 10, and housed (placed) in the cavity part 30. The functional device 20 is a cantilever beam MEMS vibrator, for example. In the illustrated example, the functional device 20 has a first electrode 22 formed on the substrate 10 and a second electrode 24 formed with a gap between the first electrode 22 and itself.

The second electrode 24 may have a support part 24a formed on the substrate 10 and a beam part 24b provided to extend from the support part 24a and face the first electrode 22. A material of the first electrode 22 and the second electrode 24 may include polysilicon doped with a predetermined impurity (e.g., boron) and provided with conductivity, for example.

In the functional device 20, when a voltage (alternating voltage) is applied between the first electrode 22 and the second electrode 24, the beam part 24b vibrates in the thickness directions of the substrate 10 because of the electrostatic force generated between the electrodes 22, 24.

The functional device 20 is not limited to the illustrated example, but may be a fixed ended beam vibrator having a beam part with both ends fixed, for example. Further, the functional device 20 may be a vibrator in which the second electrode has a support part and a first beam part and a second beam part extending from the support part in opposite directions to each other, and the first electrode is formed to respectively face the first beam part and the second beam part. Furthermore, the functional device 20 may include various other functional devices such as a quartz vibrator, a SAW (surface acoustic wave) device, an acceleration sensor, a gyroscope, and a micro actuator. As described above, the electronic device 100 may include an arbitrary functional device that may be housed in the cavity part 30.

The cavity part 30 is a space for housing the functional device 20. In the illustrated example, the cavity part 30 is defined (designated) by the substrate 10 and the coating structure 40. The interior of the cavity part 30 is under a decompression condition, for example. Thereby, the operation accuracy of the functional device 20 may be improved. Note that, though not illustrated, the cavity part 30 may further be defined by the interlayer insulating layers 50, 52.

The coating structure 40 defines (designates) the cavity part 30. The coating structure 40 includes a first conducting layer 41, a first surrounding wall 42, a second conducting layer 43, a second surrounding wall 44, a coating layer 46, and a sealing layer 48. In the illustrated example, the first conducting layer 41, the first surrounding wall 42, the second conducting layer 43, the second surrounding wall 44, the coating layer 46, and the sealing layer 48 are stacked from the substrate 10 side in this order.

The first conducting layer 41 is formed on the substrate 10. The first conducting layer 41 is a polysilicon layer doped with a predetermined impurity and provided with conductivity, for example. The first conducting layer 41 is formed around the cavity part 30 to surround the functional device 20. The planar shape of the first conducting layer 41 is rectangular, for example. Note that the planar shape of the first conducting layer 41 is not particularly limited, but may be an arbitrary shape including a circular shape and a polygonal shape.

The first surrounding wall 42 is formed on the first conducting layer 41. The first surrounding wall 42 is formed around the cavity part 30. The first surrounding wall 42 has a closed shape surrounding the functional device 20 in a plan view as shown in FIG. 2, for example. The planar shape of the first surrounding wall 42 is rectangular in the illustrated example. Note that the planar shape of the first surrounding wall 42 is not particularly limited, but may be an arbitrary shape including a circular shape and a polygonal shape. The first surrounding wall 42 defines the side surface of the cavity part 30 in the illustrated example. In the illustrated example, in the plan view, the functional device 20 is formed within a region surrounded by the first surrounding wall 42. That is, in the plan view, the size and the shape of the region surrounded by the first surrounding wall 42 are determined by the size and the shape of the functional device 20. The first surrounding wall 42 is formed in the first interlayer insulating layer 50. The first surrounding wall 42 is formed by forming a through hole by etching of the first interlayer insulating layer 50 and burying of the through hole with a metal material. That is, the first surrounding wall 42 is a via connecting the first conducting layer 41 and the second conducting layer 43.

The second conducting layer 43 is formed on the first surrounding wall 42. In the illustrated example, the second conducting layer 43 is further formed on the first interlayer insulating layer 50. The second conducting layer 43 is integrally formed with the first surrounding wall 42. That is, the second conducting layer 43 and the first surrounding wall 42 may be formed at the same step. The second conducting layer 43 is formed around the cavity part 30 to surround the functional device 20 in the plan view. The second conducting layer 43 has a closed shape surrounding the functional device 20 in the plan view, for example. The planar shape of the second conducting layer 43 is rectangular in the illustrated example. Note that the planar shape of the second conducting layer 43 is not particularly limited, but may be an arbitrary shape including a circular shape and a polygonal shape. The first surrounding wall 42 and the second conducting layer 43 are aluminum layers, titanium layers, or multilayered structures of aluminum layers and titanium layers, for example.

The second surrounding wall 44 is formed on the second conducting layer 43. That is, the second surrounding wall 44 is formed at the opposite side to the substrate 10 side with respect to the first surrounding wall 42. The second surrounding wall 44 is formed around the cavity part 30. The second surrounding wall 44 has a closed shape surrounding the functional device 20 in the plan view, for example. The planar shape of the second surrounding wall 44 is rectangular in the illustrated example. Note that the planar shape of the second surrounding wall 44 is not particularly limited, but may be an arbitrary shape including a circular shape and a polygonal shape. The second surrounding wall 44 defines the side surface of the cavity part 30. The second surrounding wall 44 is formed in the second interlayer insulating layer 52. For example, the second surrounding wall 44 is formed by forming a through hole by etching of the second interlayer insulating layer 52 and burying of the through hole with a metal material. That is, the second surrounding wall 44 is a via connecting the second conducting layer 43 and the coating layer 46.

The second surrounding wall 44 is located inside the first surrounding wall 42 in the plan view as shown in FIG. 2. Accordingly, in the plan view, the area of the region surrounded by the second surrounding wall 44 is smaller than the area of the region surrounded by the first surrounding wall 42. Here, the case where the second surrounding wall 44 is located inside the first surrounding wall 42 in the plan view includes the case where a part of the first surrounding wall 42 overlaps with a part of the second surrounding wall 44, for example, as long as the inner edge of the second surrounding wall 44 may be located inside the inner edge of the first surrounding wall 42 in the plan view. The second surrounding wall 44 is provided only within the region surrounded by the first surrounding wall 42 in the plan view.

The coating layer 46 is formed to cover the cavity part 30 from above. The coating layer 46 defines the upper surface of the cavity part 30. The coating layer 46 is formed on the cavity part 30, the second surrounding wall 44, and the second interlayer insulating layer 52 in the illustrated example. The coating layer 46 is formed on a region surrounded at least by the second surrounding wall 44 in the plan view. The coating layer 46 is integrally formed with the second surrounding wall 44. That is, the coating layer 46 and the second surrounding wall 44 may be formed at the same step. Through holes 46a are formed in the coating layer 46. In the illustrated example, 18 through holes 46a are formed, but the number is not limited. As will be described later, at the releasing step of forming the cavity part 30, an etchant or etching gas may be supplied through the through holes 46a. The second surrounding wall 44 and the coating layer 46 are aluminum layers, titanium layers, or multilayered structures of aluminum layers and titanium layers, for example.

The sealing layer 48 is provided on the coating layer 46. The sealing layer 48 seals the through holes 46a formed in the coating layer 46. Thereby, gases or the like from the outside may be prevented from entering the cavity part 30 through the through holes 46a. The sealing layer 48 is an aluminum layer, a titanium layer, or a multilayered structure of an aluminum layer and a titanium layer, for example. The coating layer 46 and the sealing layer 48 may function as a sealing member covering the cavity part 30 from above and sealing the cavity part 30.

It is desirable that a fixed potential (e.g., the ground potential) is applied to the coating structure 40. Thereby, the coating structure 40 may function as an electromagnetic shield. Accordingly, the structure may electrically shield the functional device 20 from outside.

The passivation layer 60 is formed on the coating layer 46 and the second interlayer insulating layer 52. The passivation layer 60 is a silicon nitride layer, for example.

The electronic device 100 according to the embodiment has the following advantages, for example.

In the electronic device 100, the coating structure 40 that defines the cavity part 30 has the first surrounding wall 42 formed around the cavity part 30 above the substrate 10, the second surrounding wall 44 formed around the cavity part 30 above the first surrounding wall 42, and the coating layer 46 that defines the upper surface of the cavity part 30, and the second surrounding wall 44 is located inside the first surrounding wall 42 in the plan view. As described above, the second surrounding wall 44 is located inside the first surrounding wall 42 in the plan view, and thus, compared to the case where the first surrounding wall 42 and the second surrounding wall 44 are formed to overlap with each other in the plan view, for example, the area of the region of the coating layer 46 covering the upper part of the cavity part 30 may be made smaller while the region in which the functional device 20 is formed is secured. Accordingly, bending of the coating layer 46 may be suppressed. Therefore, for example, when the protective resin such as polyimide used for mounting on an electronic substrate is applied, the coating layer 46 may be prevented from bending into contact with the functional device 20 due to the pressure of the application. Further, for example, the coating layer 46 may be prevented from bending into contact with the functional device 20 due to the pressure of dicing at chipping and the pressure when the rear surface of the substrate 10 is ground. Furthermore, according to the electronic device 100 of the embodiment, the mechanical strength of the coating structure 40 may be improved.

2. Method of Manufacturing Electronic Device

Next, a method of manufacturing the electronic device according to the embodiment will be explained with reference to the drawings. FIGS. 3 to 7 are sectional views schematically showing a manufacturing process of the electronic device 100 according to the embodiment.

Figure 3:
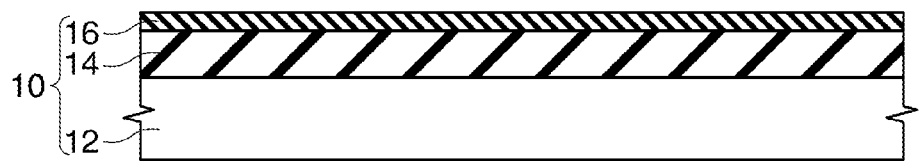
FIG. 3 is a sectional view schematically showing a manufacturing process of the electronic device according to the embodiment.

As shown in FIG. 3, the first foundation layer 14 is formed on the support substrate 12. The first foundation layer 14 is formed by the LOCOS method or the STI (shallow trench isolation) method.

Then, the second foundation layer 16 is formed on the first foundation layer 14. For example, the second foundation layer 16 is formed by deposition by the CVD (chemical vapor deposition) method or the sputtering method, and then, patterning by the photolithography technology and the etching technology. Through the steps, the substrate 10 may be formed.

Figure 4:
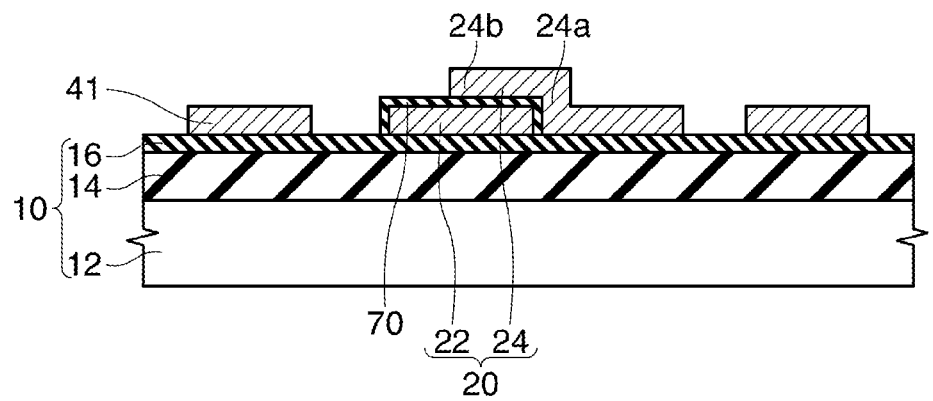
FIG. 4 is a sectional view schematically showing the manufacturing process of the electronic device according to the embodiment.

As shown in FIG. 4, the first electrode 22 is formed on the second foundation layer 16. The first electrode 22 is formed by deposition by the CVD method or the sputtering method, and then, patterning by the photolithography technology and the etching technology. When the first electrode 22 is made of polysilicon, the polysilicon is doped with a predetermined impurity for conductivity.

Then, a sacrifice layer 70 is formed to cover the first electrode 22. The sacrifice layer 70 is a silicon oxide layer, for example. The sacrifice layer 70 is formed by thermal oxidation of the first electrode 22. The thickness of the sacrifice layer 70 may be controlled by adjustment of the crystallinity and the impurity concentration of the first electrode 22. Note that the sacrifice layer 70 may be formed using the CVD method or the sputtering method.

Then, the second electrode 24 and the first conducting layer 41 are formed. The second electrode 24 is formed on the sacrifice layer 70 and the second foundation layer 16. The first conducting layer 41 is formed on the second foundation layer 16. The second electrode 24 and the first conducting layer 41 are formed by deposition by the CVD method or the sputtering method, and then, patterning by the photolithography technology and the etching technology. When the second electrode 24 and the first conducting layer 41 are made of polysilicon, the polysilicon is doped with a predetermined impurity for conductivity. As described above, at the step, the second electrode 24 and the first conducting layer 41 may be formed at the same step. Note that the first conducting layer 41 may be formed not at the same step as that of the second electrode 24, but at the same step as that of the first electrode 22. Through the steps, the functional device 20 may be formed on the substrate 10.

Figure 5:
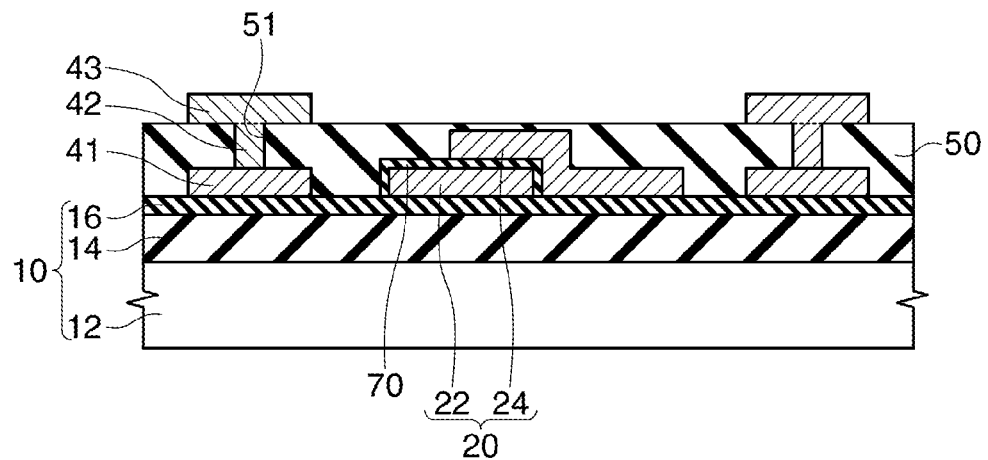
FIG. 5 is a sectional view schematically showing the manufacturing process of the electronic device according to the embodiment.

As shown in FIG. 5, the first interlayer insulating layer 50 is formed above the substrate 10 to cover the functional device 20. The first interlayer insulating layer 50 may be formed by the CVD method or an application (spin coating) method, for example. After the formation of the first interlayer insulating layer 50, processing of flattening the surface of the first interlayer insulating layer 50 may be performed. Then, the first interlayer insulating layer 50 is patterned and a through hole 51 penetrating the first interlayer insulating layer 50 is formed. The through hole 51 is formed to surround the functional device 20 in the plan view.

Then, the first surrounding wall 42 and the second conducting layer 43 are formed. The first surrounding wall 42 is formed within the through hole 51. The second conducting layer 43 is formed on the first surrounding wall 42 and the first interlayer insulating layer 50. For example, the first surrounding wall 42 and the second conducting layer 43 are formed by deposition by the sputtering method or the plating method, and then, patterning by the photolithography technology and the etching technology. At the step, the first surrounding wall 42 and the second conducting layer 43 may be formed at the same step. The first surrounding wall 42 and the second conducting layer 43 are integrally formed.

Figure 6:
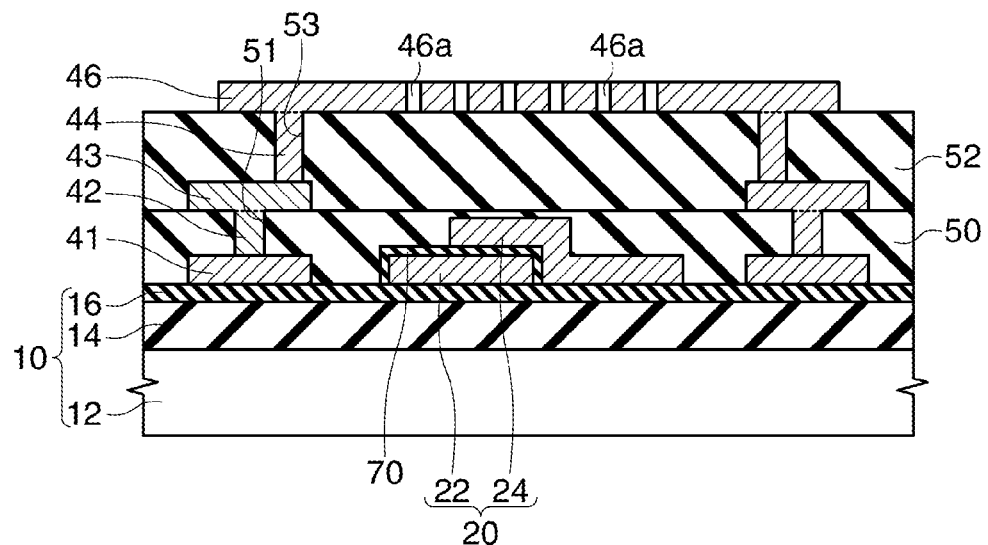
FIG. 6 is a sectional view schematically showing the manufacturing process of the electronic device according to the embodiment.

As shown in FIG. 6, the second interlayer insulating layer 52 is formed to cover the first interlayer insulating layer 50 and the second conducting layer 43. The second interlayer insulating layer 52 is formed by the CVD method or the application (spin coating) method, for example. After the formation of the second interlayer insulating layer 52, processing of flattening the surface of the second interlayer insulating layer 52 may be performed. Then, the second interlayer insulating layer 52 is patterned and a through hole 53 penetrating the second interlayer insulating layer 52 is formed. The through hole 53 is formed to surround the functional device 20 inside the through hole 51 (first conducting layer 41) in the plan view.

Then, the second surrounding wall 44 and the coating layer 46 are formed. The second surrounding wall 44 is formed within the through hole 53. The coating layer 46 is formed on the second surrounding wall 44 and the second interlayer insulating layer 52. For example, the second surrounding wall 44 and the coating layer 46 are formed by deposition by the sputtering method or the plating method, and then, patterning by the photolithography technology and the etching technology. The second surrounding wall 44 is formed within the through hole 53 located inside the through hole 51 in which the first surrounding wall 42 is formed, and thus, formed inside of the first surrounding wall 42. At the step, the second surrounding wall 44 and the coating layer 46 may be formed at the same step. The second surrounding wall 44 and the coating layer 46 are integrally formed.

Then, the through holes 64a are formed by patterning of the coating layer 46. Note that the through holes 64a may be formed at the same time at the step of forming the coating layer 46. Thereby, the manufacturing process may be simplified.

Figure 7:
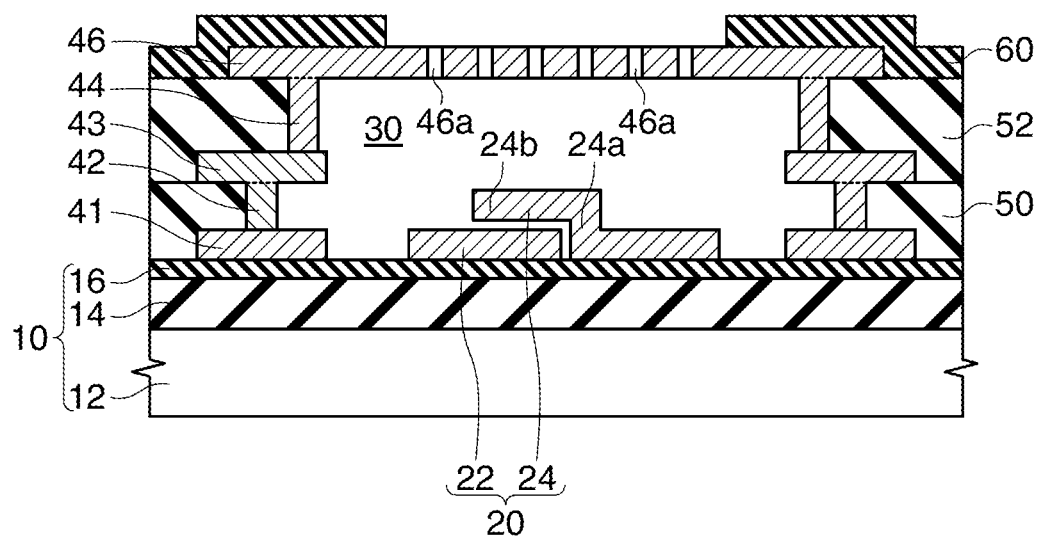
FIG. 7 is a sectional view schematically showing the manufacturing process of the electronic device according to the embodiment.

As shown in FIG. 7, the interlayer insulating layers 50, 52 and the sacrifice layer 70 above the functional device 20 are removed by passing an etchant or an etching gas through the through holes 46a, and the cavity part 30 is formed (releasing step). The releasing step is performed by wet etching using hydrofluoric acid, buffered hydrofluoric acid (mixture of hydrofluoric acid and ammonium fluoride), or the like, dry etching using hydrofluoric gas, or the like, for example. The surrounding walls 42, 44, the conducting layers 41, 43, and the coating layer 46 are formed using materials not etched at the releasing step, and thereby, the cavity part 30 may be prevented from expanding to the outside of the surrounding walls 42, 44. Further, the second foundation layer 16 may function as an etching stopper layer.

Then, the passivation layer 60 is formed on the coating layer 46 and the second interlayer insulating layer 52. The passivation layer 60 is formed by deposition by the CVD method or the sputtering method, and then, patterning by the photolithography technology and the etching technology.

As shown in FIG. 1, the sealing layer 48 that seals the through holes 46a is formed on the coating layer 46 and the passivation layer 60. The sealing layer 48 is formed by deposition by the vapor phase epitaxial method such as the CVD method and the sputtering method, and then, patterning by the photolithography technology and the etching technology. Thereby, the cavity part 30 may be sealed while remaining under the decompression condition. At the step, the coating structure 40 is formed.

Through the steps, the electronic device 100 may be manufactured.

The method of manufacturing the electronic device according to the embodiment has the following advantages, for example.

The method of manufacturing the electronic device according to the embodiment includes the step of forming the first surrounding wall 42 surrounding the functional device 20 in the first interlayer insulating layer 50 and the step of forming the second surrounding wall 44 surrounding the functional device 20 in the second interlayer insulating layer 52, and, at the step of forming the second surrounding wall 44, the second surrounding wall 44 is formed inside the first surrounding wall 42 in the plan view. Thereby, the electronic device that may suppress bending of the coating layer 46 may be obtained.

3. Modified Example of Electronic Device

Figure 8:
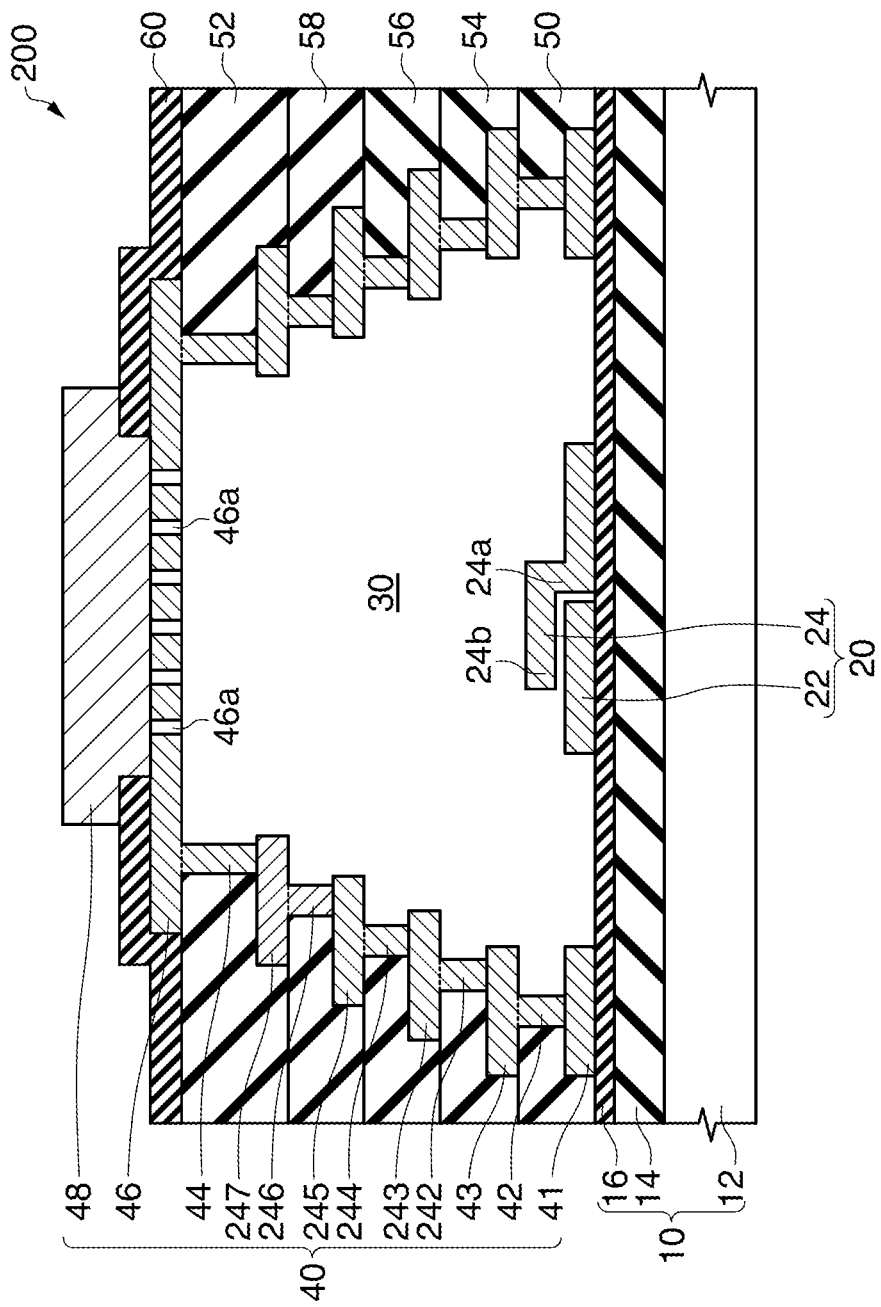
FIG. 8 is a sectional view schematically showing an electronic device according to a modified example of the embodiment.
Figure 9:
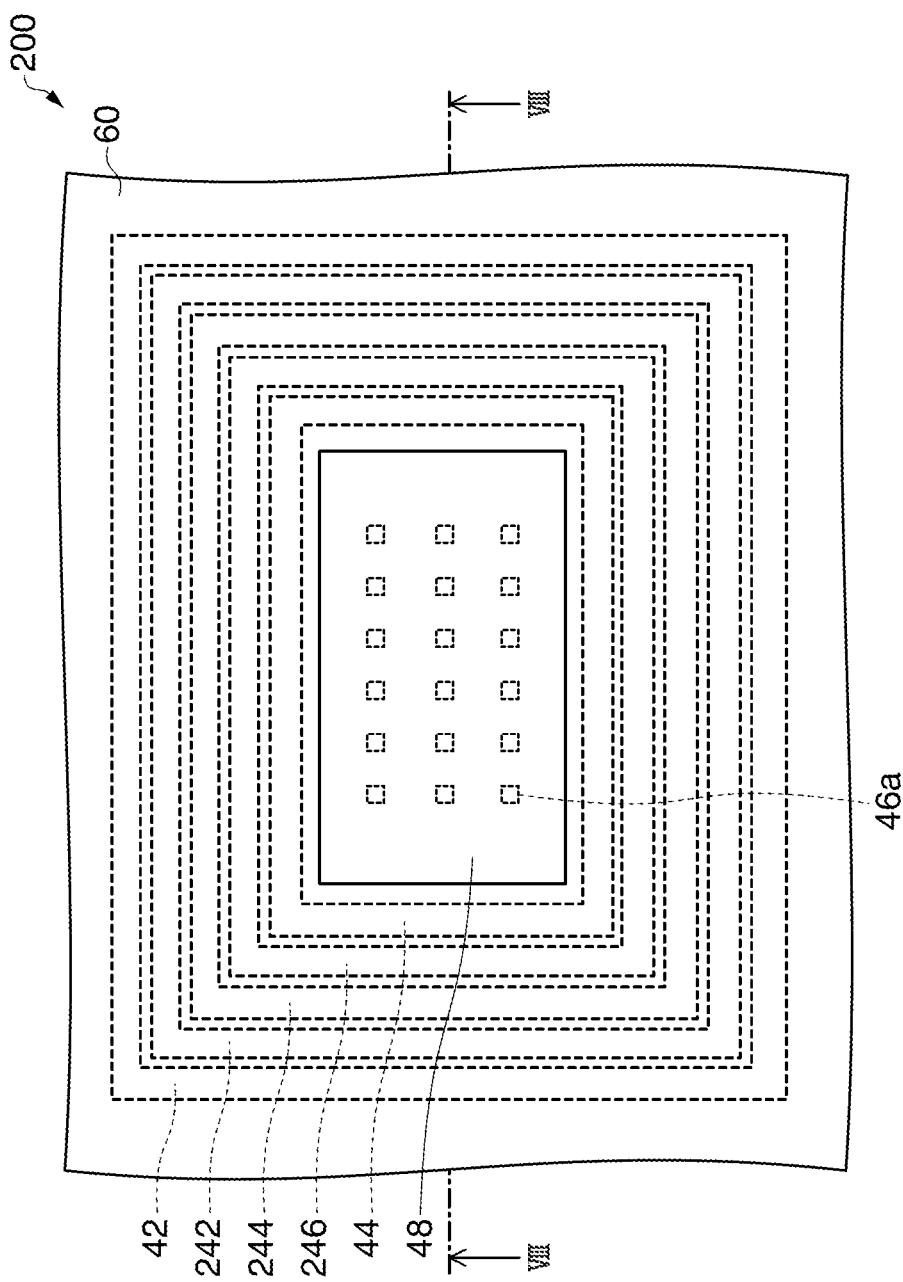
FIG. 9 is a plan view schematically showing the electronic device according to the modified example of the embodiment.

Next, a modified example of the electronic device according to the embodiment will be explained with reference to the drawings. FIG. 8 is a sectional view schematically showing an electronic device 200 according to the modified example of the embodiment. FIG. 9 is a plan view schematically showing the electronic device 200 according to the modified example of the embodiment. Note that FIG. 8 is the sectional view along line VIII-VIII in FIG. 9. As below, in the electronic device 200 according to the modified example of the embodiment, the members having the same functions as the component members of the above-described electronic device 100 have the same signs and their detailed explanation will be omitted.

The above-described electronic device 100 has the three-layer structure in which the first conducting layer 41, the second conducting layer 43, and the coating layer 46 are stacked as shown in FIGS. 1 and 2.

On the other hand, the electronic device 200 has a six-layer structure in which the first conducting layer 41, the second conducting layer 43, a third conducting layer 243, a fourth conducting layer 245, a fifth conducting layer 247, and the coating layer 46 are stacked as shown in FIGS. 8 and 9.

The electronic device 200 may further include surrounding walls 242, 244, 246, conducting layers 243, 245, 247, and interlayer insulating layers 54, 56, 58 in addition to the component members of the electronic device 100.

The third surrounding wall 242, the fourth surrounding wall 244, and the fifth surrounding wall 246 are formed between the first surrounding wall 42 and the second surrounding wall 44 as shown in FIG. 8. The third surrounding wall 242, the fourth surrounding wall 244, and the fifth surrounding wall 246 are located inside the first surrounding wall 42 in the plan view as shown in FIG. 9. The second surrounding wall 44 is located inside the third surrounding wall 242, the fourth surrounding wall 244, and the fifth surrounding wall 246. In the electronic device 200, the coating structure 40 includes the surrounding walls 42, 44, 242, 244, 246, the conducting layers 41, 43, 243, 245, 247, the coating layer 46, and the sealing layer 48. In the illustrated example, the first conducting layer 41, the first surrounding wall 42, the second conducting layer 43, the third surrounding wall 242, the third conducting layer 243, the fourth surrounding wall 244, the fourth conducting layer 245, the fifth surrounding wall 246, the fifth conducting layer 247, the second surrounding wall 44, the coating layer 46, and the sealing layer 48 are stacked from the substrate 10 side in this order.

The third surrounding wall 242 is formed on the second conducting layer 43. The third surrounding wall 242 is formed in the third interlayer insulating layer 54. For example, the third surrounding wall 242 is formed by formation of a through hole by etching of the third interlayer insulating layer 54 and burying of the through hole with a metal material. That is, the third surrounding wall 242 is a via connecting the second conducting layer 43 and the third conducting layer 243. The third surrounding wall 242 is located inside the first surrounding wall 42 in the plan view as shown in FIG. 9. Accordingly, in the plan view, the area of the region surrounded by the third surrounding wall 242 is smaller than the area of the region surrounded by the first surrounding wall 42.

The fourth surrounding wall 244 is formed on the third conducting layer 243. The fourth surrounding wall 244 is formed in the fourth interlayer insulating layer 56. For example, the fourth surrounding wall 244 is formed by formation of a through hole by etching of the fourth interlayer insulating layer 56 and burying of the through hole with a metal material. That is, the fourth surrounding wall 244 is a via connecting the third conducting layer 243 and the fourth conducting layer 245. The fourth surrounding wall 244 is located inside the third surrounding wall 242 in the plan view as shown in FIG. 9. Accordingly, in the plan view, the area of the region surrounded by the fourth surrounding wall 244 is smaller than the area of the region surrounded by the third surrounding wall 242.

The fifth surrounding wall 246 is formed on the fourth conducting layer 245. The fifth surrounding wall 246 is formed in the fifth interlayer insulating layer 58. For example, the fifth surrounding wall 246 is formed by formation of a through hole by etching of the fifth interlayer insulating layer 58 and burying of the through hole with a metal material. That is, the fifth surrounding wall 246 is a via connecting the fourth conducting layer 245 and the fifth conducting layer 247. The fifth surrounding wall 246 is located inside the fourth surrounding wall 244 in the plan view as shown in FIG. 9. Accordingly, in the plan view, the area of the region surrounded by the fifth surrounding wall 246 is smaller than the area of the region surrounded by the fourth surrounding wall 244.

The surrounding walls 242, 244, 246 are formed around the cavity part 30. For example, the surrounding walls 242, 244, 246 have closed shapes surrounding the functional device 20 in the plan view. The planar shapes of the surrounding walls 242, 244, 246 are rectangular in the illustrated example. Note that the planar shapes of the surrounding walls 242, 244, 246 are not particularly limited, but may be arbitrary shapes including circular shapes and polygonal shapes. The surrounding walls 242, 244, 246 define the side surface of the cavity part 30. The surrounding walls 242, 244, 246 are formed at the same step as that of the above-described first surrounding wall 42, for example.

In the electronic device 200, the second surrounding wall 44 is formed on the fifth conducting layer 247. The second surrounding wall 44 is located inside the fifth surrounding wall 246 in the plan view as shown in FIG. 9. Accordingly, in the plan view, the area of the region surrounded by the second surrounding wall 44 is smaller than the area of the region surrounded by the fifth surrounding wall 246.

The third conducting layer 243 is formed on the third surrounding wall 242. In the illustrated example, the third conducting layer 243 is further formed on the third interlayer insulating layer 54. The third conducting layer 243 is integrally formed with the third surrounding wall 242. That is, the third conducting layer 243 and the third surrounding wall 242 may be formed at the same step. The third conducting layer 243 and the third surrounding wall 242 are aluminum layers, titanium layers, or multilayered structures of aluminum layers and titanium layers, for example. The third conducting layer 243 has a closed shape surrounding the functional device 20 in the plan view, for example.

The fourth conducting layer 245 is formed on the fourth surrounding wall 244. In the illustrated example, the fourth conducting layer 245 is further formed on the fourth interlayer insulating layer 56. The fourth conducting layer 245 is integrally formed with the fourth surrounding wall 244. That is, the fourth conducting layer 245 and the fourth surrounding wall 244 may be formed at the same step. The fourth conducting layer 245 and the fourth surrounding wall 244 are aluminum layers, titanium layers, or multilayered structures of aluminum layers and titanium layers. The fourth conducting layer 245 has a closed shape surrounding the functional device 20 in the plan view, for example.

The fifth conducting layer 247 is formed on the fifth surrounding wall 246. In the illustrated example, the fifth conducting layer 247 is further formed on the fifth interlayer insulating layer 58. The fifth conducting layer 247 is integrally formed with the fifth surrounding wall 246. That is, the fifth conducting layer 247 and the fifth surrounding wall 246 may be formed at the same step. The fifth conducting layer 247 and the fifth surrounding wall 246 are aluminum layers, titanium layers, or multilayered structures of aluminum layers and titanium layers, for example. The fifth conducting layer 247 has a closed shape surrounding the functional device 20 in the plan view, for example. The conducting layers 243, 245, 247 are formed at the same step as that of the second conducting layer 43.

The electronic device 200 according to the embodiment has the following advantages, for example.

In the electronic device 200, the coating structure 40 that defines the cavity part 30 has the first surrounding wall 42 formed around the cavity part 30 above the substrate 10, the second surrounding wall 44 formed around the cavity part 30 above the first surrounding wall 42, the third surrounding wall 242 formed around the cavity part 30 between the first surrounding wall 42 and the second surrounding wall 44, and the coating layer 46 that defines the upper surface of the cavity part 30, and the third surrounding wall 242 is located inside the first surrounding wall 42 in the plan view and the second surrounding wall 44 is located inside the third surrounding wall 242 in the plan view. Thereby, compared to the above-described electronic device 100, the area of the region of the coating layer 46 covering the upper part of the cavity part 30 may be made smaller, and thus, bending of the coating layer 46 may be further suppressed.

Note that, here, the case where the electronic device 200 has the six-layer structure has been explained, and the number of layers is not particularly limited, but may be two or more.

4. Oscillator

Figure 10:
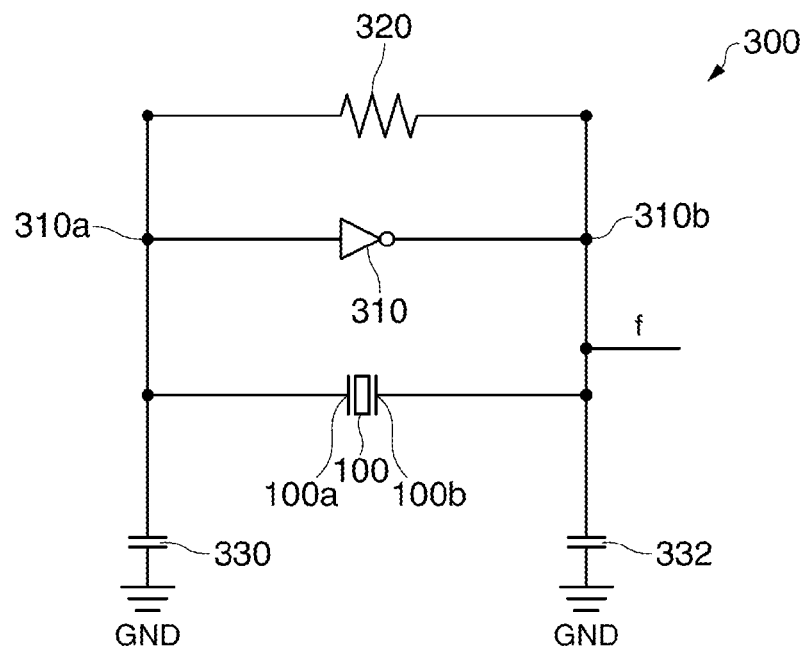
FIG. 10 is a circuit diagram showing an oscillator according to the embodiment.

Next, an oscillator according to the embodiment will be explained with reference to the drawings. FIG. 10 is a circuit diagram showing an oscillator 300 according to the embodiment.

As shown in FIG. 10, for example, the oscillator 300 includes the electronic device (e.g., electronic device 100) according to the embodiment of the invention and an inverting amplifier circuit (circuit unit) 310.

The electronic device 100 has a first terminal 100a electrically connected to the first electrode 22 of the functional device 20, and a second terminal 100b electrically connected to the second electrode 24 of the functional device 20. The first terminal 100a of the electronic device 100 is at least alternately connected to an input terminal 310a of the inverting amplifier circuit 310. The second terminal 100b of the electronic device 100 is at least alternately connected to an output terminal 310b of the inverting amplifier circuit 310.

In the illustrated example, the inverting amplifier circuit 310 includes one inverter, however, may be formed by combining a plurality of inverters (inverting circuits) and amplifier circuits for satisfaction of a desired oscillation condition.

The oscillator 300 may include a feedback resistor with respect to the inverting amplifier circuit 310. In the example shown in FIG. 10, the input terminal and the output terminal of the inverting amplifier circuit 310 are connected via a resistor 320.

The oscillator 300 includes a first capacitor 330 connected between the input terminal 310a of the inverting amplifier circuit 310 and a reference potential (ground potential), and a second capacitor 332 connected between the output terminal 310b of the inverting amplifier circuit 310 and a reference potential (ground potential). Thereby, an oscillator circuit in which a resonator circuit is formed by the electronic device 100 and the capacitors 330, 332 may be obtained. The oscillator 300 outputs an oscillation signal f obtained by the oscillator circuit.

The devices (not shown) including transistors and capacitors forming the oscillator 300 may be formed on the support substrate 12 (see FIG. 1), for example. Thereby, the electronic device 100 and the inverting amplifier circuit 310 may be monolithically formed.

When the devices including the transistors forming the oscillator 300 are formed on the support substrate 12, the devices including the transistors forming the oscillator 300 may be formed at the same steps as the steps of forming the above-described electronic device 100. Specifically, at the step of forming the sacrifice layer 70 (see FIG. 4), the gate insulating layers of the transistors may be formed. Further, at the step of forming the second electrode 24 (see FIG. 4), the gate electrodes of the transistors may be formed. As described above, the manufacturing steps of the electronic device 100 and the manufacturing steps of the devices including the transistors forming the oscillator 300 are made common, and thereby, the manufacturing process may be simplified.

According to the oscillator 300, the electronic device 100 that may suppress bending of the coating layer 46 defining the cavity part 30 in which the functional device 20 is placed may be included.

Figure 11:
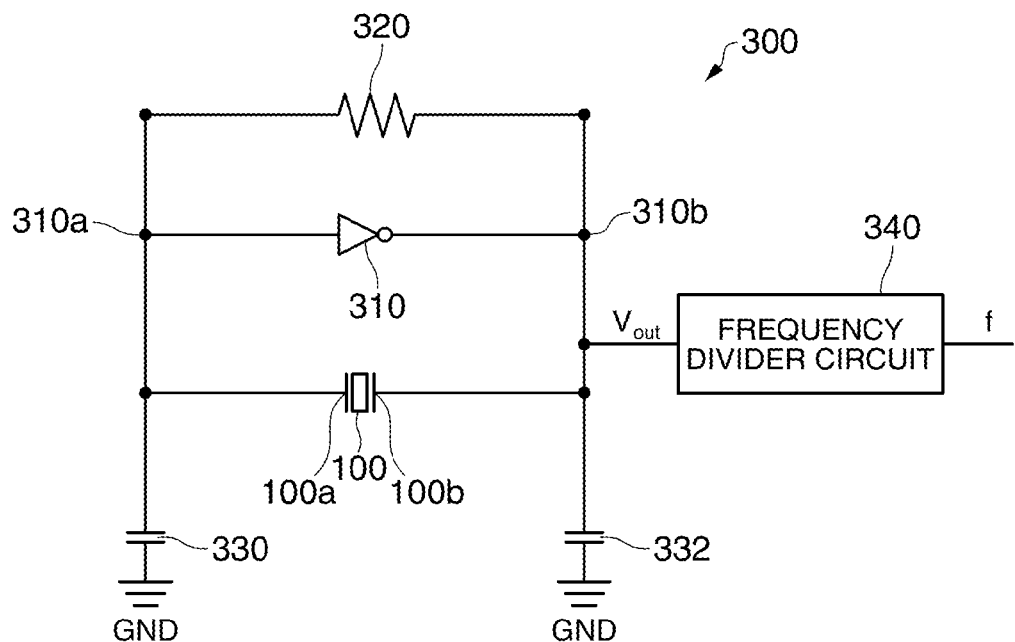
FIG. 11 is a circuit diagram showing an oscillator according to a modified example of the embodiment.

Note that, as shown in FIG. 11, the oscillator 300 may further have a frequency divider circuit 340. The frequency divider circuit 340 divides the frequency of the output signal $V_{out}$ of the oscillator circuit and outputs the oscillation signal f. Thereby, the oscillator 300 may obtain an output signal at the lower frequency than the frequency of the output signal $V_{out}$, for example.

The invention includes substantially the same configurations (the same configurations in function, method, and result or the same configurations in purpose and advantage) as the configurations explained in the embodiments. Further, the invention includes configurations in which non-essential parts of the configurations explained in the embodiments are replaced. Furthermore, the invention includes configurations that may exert the same effects or achieve the same purposes as those of the configurations explained in the embodiments. In addition, the invention includes configurations formed by adding known technologies to the configurations explained in the embodiments.

The entire disclosure of Japanese Patent Application No. 2012-199160, filed Sep. 11, 2012 is expressly incorporated by reference herein.

What is claimed is:

1. An electronic device comprising:
   a substrate;
   a functional device provided above the substrate;
   a first surrounding wall provided around the functional device above the substrate;
   a second surrounding wall located inside the first surrounding wall in a plan view and provided to surround the functional device at an opposite side to the substrate side with respect to the first surrounding wall; and
   a coating structure overlapping with the functional device in the plan view above the second surrounding wall.

2. The electronic device according to claim 1, wherein the coating structure is integrated with the second surrounding wall.

3. The electronic device according to claim 1, wherein a third surrounding wall is located between the first surrounding wall and the second surrounding wall in a direction in which the substrate overlaps with the functional device and between the first surrounding wall and the second surrounding wall in the plan view.

4. The electronic device according to claim 1, wherein the first surrounding wall and the second surrounding wall define a side surface of a region in which the functional device is provided.

5. An oscillator comprising:
   the electronic device according to claim 1; and
   a circuit unit electrically connected to the functional device of the electronic device.

6. An oscillator comprising:
   the electronic device according to claim 2; and
   a circuit unit electrically connected to the functional device of the electronic device.

7. A method of manufacturing an electronic device comprising:
   forming a functional device above a substrate;
   forming a first interlayer insulating layer above the substrate to cover the functional device;
   forming a first surrounding wall that surrounds the functional device in the first interlayer insulating layer;
   forming a second interlayer insulating layer above the first interlayer insulating layer;
   forming a second surrounding wall that surrounds the functional device at an opposite side to the substrate side with respect to the first surrounding wall in the second interlayer insulating layer;
   forming a coating layer above the second interlayer insulating layer;
   forming a through hole in the coating layer; and
   removing the first interlayer insulating layer and the second interlayer insulating layer above the functional device through the through hole,
   wherein in the forming of the second surrounding wall, the second surrounding wall is formed inside the first surrounding wall in a plan view.

8. The method of manufacturing the electronic device according to claim 6, wherein in the forming of the coating layer, the coating layer is formed integrally with the second surrounding wall.

9. The method of manufacturing the electronic device according to claim 6, further comprising:
   forming a third interlayer insulating layer above the first interlayer insulating layer before the forming of the second interlayer insulating layer; and
   forming a third surrounding wall that surrounds the functional device in the third interlayer insulating layer,
   wherein in the forming of the third surrounding wall, the third surrounding wall is formed inside the first surrounding wall in the plan view, and
   in the forming of the second surrounding wall, the second surrounding wall is formed inside the third surrounding wall in the plan view.

\* \* \* \* \*